US006956267B2

(12) United States Patent
Hattangady et al.

(10) Patent No.: US 6,956,267 B2
(45) Date of Patent: Oct. 18, 2005

(54) SEMICONDUCTOR WITH A NITRIDED SILICON GATE OXIDE AND METHOD

(75) Inventors: Sunil V. Hattangady, McKinney, TX (US); Jaideep Mavoori, Redmond, TX (US); Che-Jen Hu, Plano, TX (US); Rajesh B. Khamankar, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/783,081

(22) Filed: Feb. 19, 2004

(65) Prior Publication Data

US 2004/0159898 A1 Aug. 19, 2004

Related U.S. Application Data

(62) Division of application No. 10/326,188, filed on Dec. 20, 2002, now Pat. No. 6,716,695.

(51) Int. Cl.[7] .............................................. H01L 29/76
(52) U.S. Cl. ...................................... 257/411; 257/288
(58) Field of Search ................................ 257/288, 406, 257/410, 411

(56) References Cited

U.S. PATENT DOCUMENTS

| 6,407,435 | B1 * | 6/2002 | Ma et al. ..................... 257/411 |
| 6,420,729 | B2 * | 7/2002 | Wallace et al. ............... 257/64 |
| 6,511,876 | B2 * | 1/2003 | Buchanan et al. .......... 438/240 |
| 6,674,138 | B1 * | 1/2004 | Halliyal et al. ............. 257/411 |
| 6,696,332 | B2 * | 2/2004 | Visokay et al. ............. 438/216 |

\* cited by examiner

*Primary Examiner*—George Eckert
*Assistant Examiner*—N. Drew Richards
(74) *Attorney, Agent, or Firm*—Jacqueline J. Garner; W. James Brady, III; Frederick J. Telecky, Jr.

(57) ABSTRACT

A method of fabricating a transistor includes providing a semiconductor substrate having a surface and forming a nitride layer outwardly of the surface of the substrate. The nitride layer is oxidized to form a nitrided silicon oxide layer comprising an oxide layer beneath the nitride layer. A high-K layer is deposited outwardly of the nitride layer, and a conductive layer is formed outwardly of the high-K layer. The conductive layer, the high-K layer, and the nitrided silicon oxide layer are etched and patterned to form a gate stack. Sidewall spacers are formed outwardly of the semiconductor substrate adjacent to the gate stack, and source/drain regions are formed in the semiconductor substrate adjacent to the sidewall spacers.

4 Claims, 2 Drawing Sheets

SEMICONDUCTOR WITH A NITRIDED SILICON GATE OXIDE AND METHOD

This is a divisional application of Ser. No. 10/326,188 filed Dec. 20, 2002 now U.S. Pat. No. 6,716,695.

TECHNICAL FIELD OF THE INVENTION

This invention relates generally to the field of integrated circuit fabrication, and more particularly to a semiconductor with a nitrided silicon gate oxide and a method for forming same.

BACKGROUND OF THE INVENTION

Presently, there is a great demand for shrinking semiconductor devices to provide an increased density of devices on the semiconductor chip that are faster and consume less power. The scaling of devices in the lateral dimension requires vertical scaling as well so as to achieve adequate device performance.

Gate stacks may comprise a gate oxide overlying a gate dielectric. The gate oxide may comprise silicon dioxide or, more recently, a nitrided gate oxide. Traditionally, plasma-assisted nitridation of silicon oxide to form nitrided gate oxide structures is achieved by creating a silicon dioxide layer on the surface of a substrate and reacting the silicon dioxide layer with ionized nitrogen generated by a plasma source.

SUMMARY OF THE INVENTION

A method of fabricating a transistor includes providing a semiconductor substrate having a surface and forming a nitride layer outwardly of the surface of the substrate. The nitride layer is oxidized to form a nitrided silicon oxide layer comprising an oxide layer beneath the nitride layer. A high-K layer is deposited outwardly of the nitride layer, and a conductive layer is formed outwardly of the high-K layer. The conductive layer, the high-K layer, and the nitrided silicon oxide layer are etched and patterned to form a gate stack. Sidewall spacers are formed outwardly of the semiconductor substrate adjacent to the gate stack, and source/drain regions are formed in the semiconductor substrate adjacent to the sidewall spacers.

Technical advantages of the present invention include an improved gate dielectric with low nitrogen incorporation in the substrate. The low nitrogen incorporation increases electron mobility and limits voltage shift. In addition, low nitrogen incorporation limits migration of oxygen atoms into the substrate and thus increases the efficiency of transistor components.

Certain embodiments may possess none, one, some, or all of these technical features and advantages and/or additional technical features and advantages. Other technical advantages will be readily apparent to one skilled in the art from the following figures, description, and claims.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

FIGS. 1A–1G are a series of schematic cross-sectional diagrams illustrating a method of fabricating a transistor in accordance with one embodiment of the present invention. The method shown in FIGS. 1A–1G may be used in both positive metal oxide semiconductor (PMOS) and negative metal oxide semiconductor (NMOS) devices.

Figure 1A:
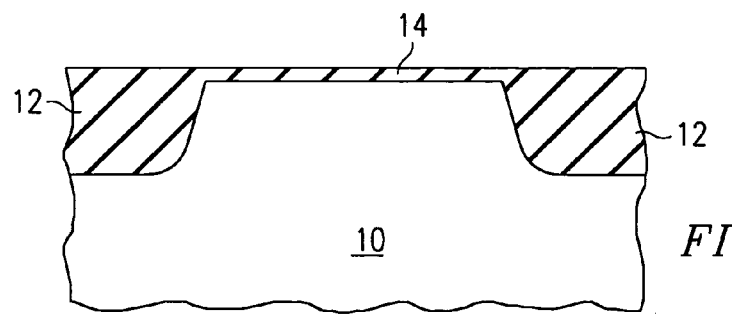
FIGS. 1A–G are a series of schematic cross-sectional diagrams illustrating a method of method of fabricating a transistor in accordance with one embodiment of the present invention.

Referring to FIG. 1A, substrate 10 may comprise a silicon substrate or silicon epitaxial layer. However, other substrates may alternatively be used. Substrate 10 will conventionally have already undergone several processing steps. For example, formation of isolation structures 12 may have been performed. An oxide layer 14 may have formed on the surface of the substrate due to exposure of the substrate to air or otherwise.

Figure 1B:
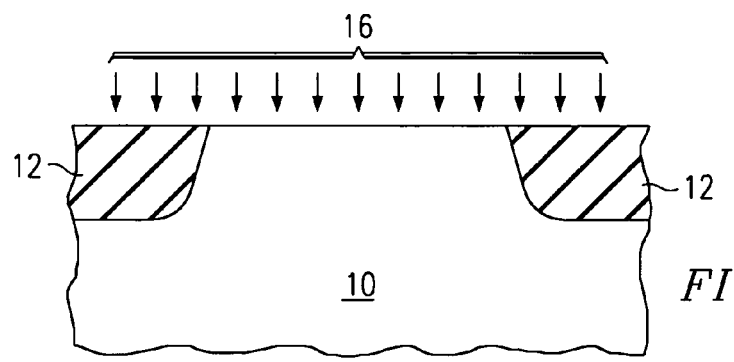

Referring to FIG. 1B, the substrate 10 is stripped with hydrofluoric acid (HF) 16 or otherwise treated or cleaned so as to remove oxide layer 14 and/or other impurities from the surface of the substrate.

Figure 1C:
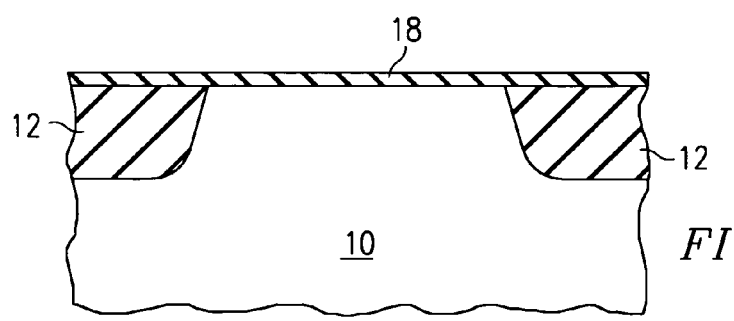

Referring to FIG. 1C, nitride layer 18 is formed outwardly of the surface of the substrate 10. In one embodiment, nitride layer 18 may be formed outwardly of the substrate by being formed on the substrate. In another embodiment, nitride layer 18 may be formed outwardly of the substrate by being formed on an intermediate layer. In a particular embodiment, the nitride layer 18 may be formed by subjecting the surface of the substrate 10 to plasma 17. The source of nitrogen for the plasma 17 may be a nitrogen containing precursor such as $N_2$ or $NH_3$ or a mixture thereof with a suitable inert gas (He, Ar, etc.) or oxidizing gas (NO, $N_2O$, $O_2$, etc.). The plasma is preferably a high density plasma. The plasma may be generated by a helical-resonator source, an electron-cyclotron resonance source, or an inductively coupled source.

During plasma nitridation, the substrate 10 may be unbiased, in which case the ionized substances are accelerated by the plasma potential (on the order of 20 Volts) and then implanted into the substrate 10 surface. A bias can be applied to the substrate 10 to further accelerate the ions from the plasma and implant them deeper into the surface. Either a direct current (DC) or radio frequency (RF) bias may be applied to the substrate 10.

In a particular embodiment, the plasma nitridation process may comprise the following process conditions: plasma density between $1 \times 10^{10}$ to $1 \times 10^{12}$ $cm^{-3}$; nitrogen flow between 1–2000 sccm preferably 1–100 sccm); pressures on the order of 1–300 mTorr (preferably 1–50 mTorr), temperature in the range of 77 K to 773 K; substrate bias in the range of 0 to 200 Volts; a temperature may be less than about 500° C.; and a duration in the range of 1 to 300 seconds. Nitride layer 18 may comprise a mixture of $Si_3N_4$ and $SiO_xN_4$. In a particular embodiment, the nitride layer 12 may have a thickness of about 10–12 Angstroms.

Figure 1D:
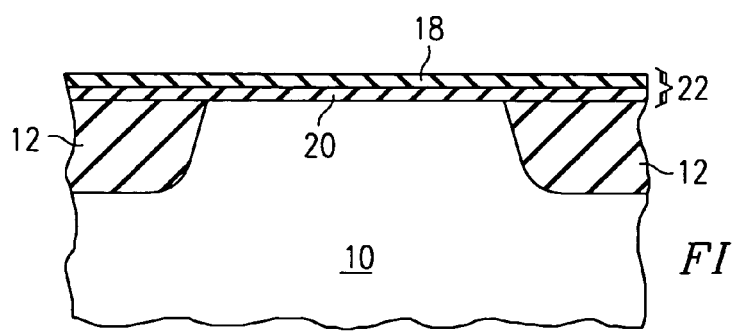

Referring to FIG. 1D, after the formation of nitride layer 18, oxide layer 20 is formed beneath nitride layer 18. In a particular embodiment, oxide layer 20 is formed beneath nitride layer 18 by thermal oxidation of the substrate 10 and nitride layer 18. Thermal oxidation in a particular embodiment may take place at a temperature of about 600–1000° C. in an oxidizing ambient such as $O_2$, $N_2O$, NO, dilute steam, or another suitable oxidant. The oxide layer 20 may comprise $SiO_2$, but may also comprise an amount of nitrogen in the form of $SiO_xN_4$ or other compounds. Nitride layer 18 may retard the oxidation, resulting in control over the thickness of the oxide layer 20. Together, nitride layer 18 and oxide layer 20 form nitrided silicon oxide layer 22. The thickness of the nitrided silicon oxide layer 22 may be optimized for using the nitrided silicon oxide as a gate oxide. In a particular embodiment, oxide layer 20 may have a thickness of about 2–10 angstroms and nitrided silicon gate oxide layer 22 may have a thickness of about 14–20 angstroms.

Figure 1E:
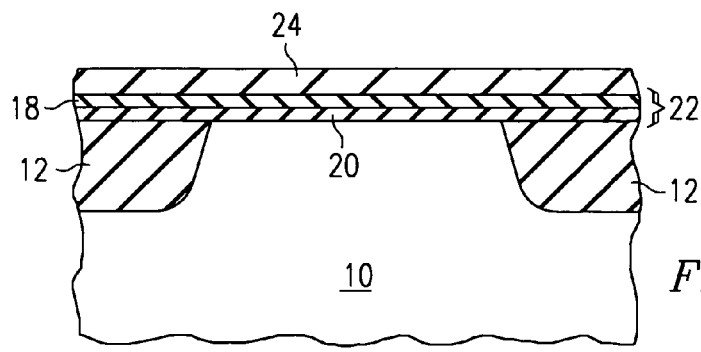

Referring to FIG. 1E, in a particular embodiment, a gate dielectric 24 comprising a material with a high dielectric constant, or with "high-K," is formed outwardly of nitride layer 18. High-K is used herein to refer to a dielectric material having a dielectric constant greater than about 7. In particular embodiments, materials having a dielectric constant from 7 to 30 may be used. The high-K dielectric layer may comprise an oxygen-containing material such as $Ta_2O_5$, $BaTiO_3$, $TiO_2$, $CeO_2$, or barium strontium titanate. The high-K dielectric layer 24 may be formed by thermal or plasma-assisted processes, atomic layer epitaxy, or by any other suitable methods.

Figure 1F:
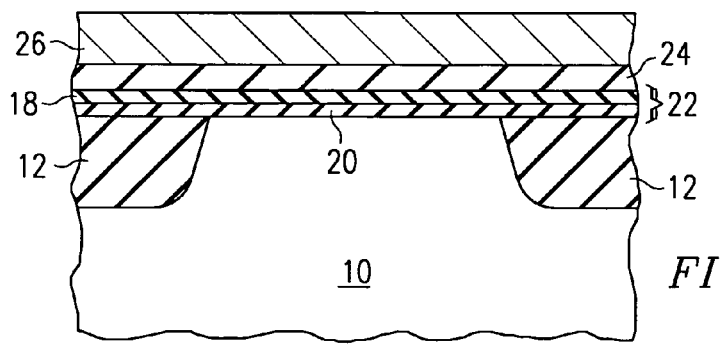

Referring to FIG. 1F, conductive layer 26 is formed outwardly of high-K layer 24. Conductive layer 26 may comprise polysilicon, metal, or another suitable gate material.

Figure 1G:
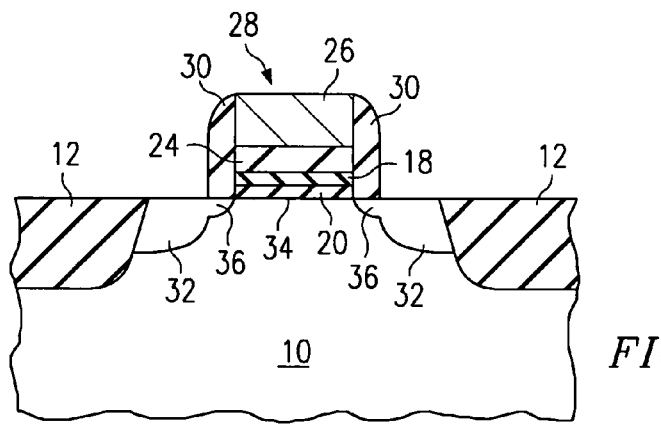

Referring to FIG. 1G, conductive layer 26, high-K dielectric layer 24, and nitrided silicon oxide layer 22 are patterned and etched to form gate stack 28 including gate (layer 26) and gate dielectrics (layers 22 and 24). Fabrication of transistor 40 may be completed by implanting drain extension regions 36, depositing and etching a dielectric to form sidewall spacers 30, and implanting source/drain regions 32.

Figure 2:
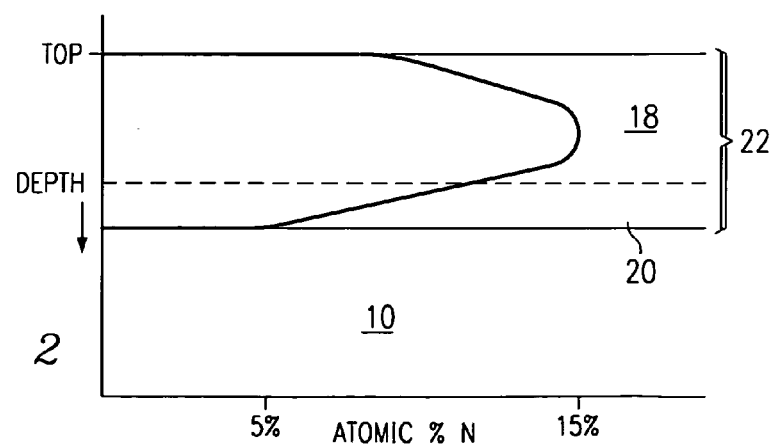
FIG. 2 is a graph illustrating a profile of atomic percentage of nitrogen in the gate stack in accordance with one embodiment of the present invention.

FIG. 2 is a graph illustrating an example profile of atomic percentage of nitrogen in nitride layer 18 and oxide layer 20 accordance with one embodiment of the present invention. Substrate 10, nitride layer 18, and oxide layer 20 are shown on FIG. 2 relative to depth. The profile of atomic percentage of nitrogen reflects the oxidation of the nitride layer 18 and substrate 10 as described in reference to FIG. 1D.

In the illustrated embodiment, the atomic percentage of nitrogen at the top of nitride layer 18 is about 9% (and this value ranges from 6% to 12% in particular embodiments), and the percentage peaks at 15% within nitride layer 18 (the peak may range from 10% to 20% in particular embodiments). The percentage decreases with depth within oxide layer 20, reaching about 11% at the boundary between substrate 10 and oxide layer 20 (and this value ranges from 8% to 14% in particular embodiments). Although example values and ranges of atomic percentage of nitrogen have been given, it should be understood that any appropriate values may be used in particular embodiments.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A semiconductor structure, comprising:
   a semiconductor substrate having a surface;
   a gate stack outward of the surface of the semiconductor substrate, the gate stack comprising:
   a nitrided silicon layer comprising an oxide layer beneath a nitride layer, wherein the nitride layer has a maximum atomic percentage of nitrogen of between 10 and 20 percent and the oxide layer has a maximum atomic percentage of nitrogen of between 8 and 14 percent;
   a high-K dielectric layer outward of the nitrided silicon oxide layer; and
   a conductive layer outward of the high-K layer;
   sidewall spacers outward of the semiconductor substrate adjacent to the gate stack; and
   source/drain regions in the semiconductor substrate adjacent to the sidewall spacers.

2. The semiconductor structure of claim 1, wherein a thickness of the nitrided silicon oxide layer is less than about 20 Angstroms.

3. The semiconductor structure of claim 1, wherein the high-K dielectric layer comprises an oxygen-containing material.

4. The semiconductor structure of claim 1, wherein the high-K dielectric layer comprises a material selected from the group consisting of $Ta_2O_5$, $BaTiO_3$, $TiO_2$, $CeO_2$, and barium strontium titanate.

* * * * *